(12) United States Patent
Tung

(10) Patent No.: US 11,677,394 B2
(45) Date of Patent: Jun. 13, 2023

(54) SIGNAL OUTPUT APPARATUS AND METHOD

(71) Applicant: REALTEK SEMICONDUCTOR CORPORATION, Hsinchu (TW)

(72) Inventor: Ming-Hui Tung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 151 days.

(21) Appl. No.: 17/395,499

(22) Filed: Aug. 6, 2021

(65) Prior Publication Data

US 2022/0052682 A1 Feb. 17, 2022

(30) Foreign Application Priority Data

Aug. 11, 2020 (TW) ................................. 109127224

(51) Int. Cl.
*H03K 17/10* (2006.01)
*H03K 17/30* (2006.01)
(Continued)

(52) U.S. Cl.
CPC ......... *H03K 17/102* (2013.01); *G06F 13/382* (2013.01); *H03K 17/04106* (2013.01); *H03K 17/302* (2013.01)

(58) Field of Classification Search
CPC ........... G06F 2213/0042; G06F 13/382; G06F 13/4072; H03K 17/687; H03K 19/018528; H03K 19/018578; H03K 17/302; H03K 19/018514; H03K 17/04106; H03K 17/102; H03K 19/00361; H03K 19/0175;
(Continued)

(56) References Cited

U.S. PATENT DOCUMENTS 7,173,453 B2 * 2/2007 Prather .......... H03K 19/018528
326/63
7,663,394 B2 * 2/2010 Yamase ................ H03K 17/302
324/520
(Continued)

FOREIGN PATENT DOCUMENTS

DE 10255642 B4 * 7/2006 ....... H03K 19/01707
EP 3113361 A1 * 1/2017 ................ H02J 3/01
(Continued)

*Primary Examiner* — Vibol Tan
(74) *Attorney, Agent, or Firm* — WPAT, P.C

(57) ABSTRACT

The present invention discloses a signal output apparatus. Each of two output circuits includes an inverter including an input terminal and an output terminal, and a resistor coupled between the output terminal and a differential output terminal. Each of MOS capacitors is coupled between the output terminals. Under a first operation mode, two current supplying circuits are disabled. The input terminals respectively receive a high and a low state input voltages and the output terminals generate a low and a high state output voltages. The capacitances become larger than a predetermined level. Under a second operation mode, one of the current supplying circuits is enabled to output a supplying current to the differential output terminal. The input terminals receive the high state input voltage. The output terminals generate the low state output voltage. The capacitances become not larger than the predetermined level.

12 Claims, 2 Drawing Sheets

(51) Int. Cl.
*H03K 17/04* (2006.01)
*G06F 13/38* (2006.01)
*H03K 17/041* (2006.01)

(58) Field of Classification Search
CPC ....... H03K 19/018521; H03K 19/0944; H03K 19/0948; H03K 19/17744; H03K 3/35613; H03K 17/145; H03K 17/6872; H03K 19/017509; H03K 19/01812; H03K 2005/00208; H03K 5/2481
See application file for complete search history.

(56) References Cited

U.S. PATENT DOCUMENTS

| | | | |
|---|---|---|---|
| 7,778,097 B2 * | 8/2010 | Chung | H03K 19/0175 365/207 |
| 9,960,735 B1 * | 5/2018 | Ding | H03D 7/1441 |
| 11,277,108 B1 * | 3/2022 | Ibrahim | H03F 3/195 |

FOREIGN PATENT DOCUMENTS

| | | | | |
|---|---|---|---|---|
| JP | 2001085977 A | * | 3/2001 | |
| WO | WO-2007086255 A1 | * | 8/2007 | ............ H02M 7/103 |

* cited by examiner

SIGNAL OUTPUT APPARATUS AND METHOD

BACKGROUND OF THE INVENTION

1. Field of the Invention

The present invention relates to a signal output apparatus and a signal output method.

2. Description of Related Art

Universal serial bus (USB) is a serial bus standard configured to connect a computer system with external devices, and is also a technology specification of input/output interface. Since the USB interface is a common standard for various kinds of external devices and is easy to plug in and plug out, the USB interface becomes the mainstream connection interface.

The output circuits equipped with USB 2.0 interface can support operation modes having different transmission speeds. However, under the operation modes having different transmission speeds, the output circuits operate according to different operation voltages that result in different amounts of capacitances of parasitic capacitors in the components. Output signals of the components may have a slew rate that is too fast or too slow, and may have the issue of voltage overshoot and voltage undershoot under different operation modes if an adjusting mechanism is absent due to the presence of the parasitic capacitors.

SUMMARY OF THE INVENTION

In consideration of the problem of the prior art, an object of the present invention is to supply a signal output apparatus and a signal output method.

The present invention discloses a signal output apparatus that includes two output circuits, two MOS capacitors and two current supplying circuits. Each of the two output circuits includes an inverter and a resistor. The inverter includes an input terminal and an output terminal. The resistor is electrically coupled between the output terminal and a differential output terminal Each of the two MOS capacitors is electrically coupled between the output terminals of the two output circuits in opposite directions. Each of the two current supplying circuits is electrically coupled to the differential output terminal of one of the two output circuits. Under a first operation mode, the two current supplying circuits are disabled such that the input terminals of the two output circuits respectively receive a high state input voltage and a low state input voltage, and the output terminals respectively generate a low state output voltage and a high state output voltage to control a capacitance of each of the two MOS capacitors to be larger than a predetermined level. Under a second operation mode, only one of the two current supplying circuits is enabled to output a supplying current to the corresponding differential output terminal such that the input terminals of the two output circuits respectively receive the high state input voltage, and the output terminals respectively generate the low state output voltage to control the capacitance of each of the two MOS capacitors to be not larger than the predetermined level.

The present invention also discloses a signal output method used in a signal output apparatus, wherein the signal output apparatus includes two output circuits, two MOS capacitors and two current supplying circuits, the two output circuits each including an inverter that comprises an input terminal and an output terminal, and a resistor electrically coupled to the output terminal and a differential output terminal, the two MOS capacitors each electrically coupled to the output terminals of the two output circuits in opposite directions, the two current supplying circuits each electrically coupled to the differential output terminal of one of the two output circuits, and the signal output method includes the steps outlined below. Under a first operation mode, the two current supplying circuits are disabled. Under the first operation mode, a high state input voltage and a low state input voltage are respectively received by the input terminals of the two output circuits, and a low state output voltage and a high state output voltage are respectively generated by the output terminals to control a capacitance of each of the two MOS capacitors to be larger than a predetermined level. Under a second operation mode, only one of the two current supplying circuits is enabled to output a supplying current to the corresponding differential output terminal Under the second operation mode, the high state input voltage is respectively received by the input terminals of the two output circuits, and the low state output voltage is respectively generated by the output terminals to control the capacitance of each of the two MOS capacitors to be not larger than the predetermined level.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a signal output apparatus and a signal output method to, by disposing MOS capacitors between two output terminals, generate different amounts of capacitances according to operation modes having different speeds to lower the impact of the parasitic capacitor, so as to improve the signal output performance.

Figure 1:
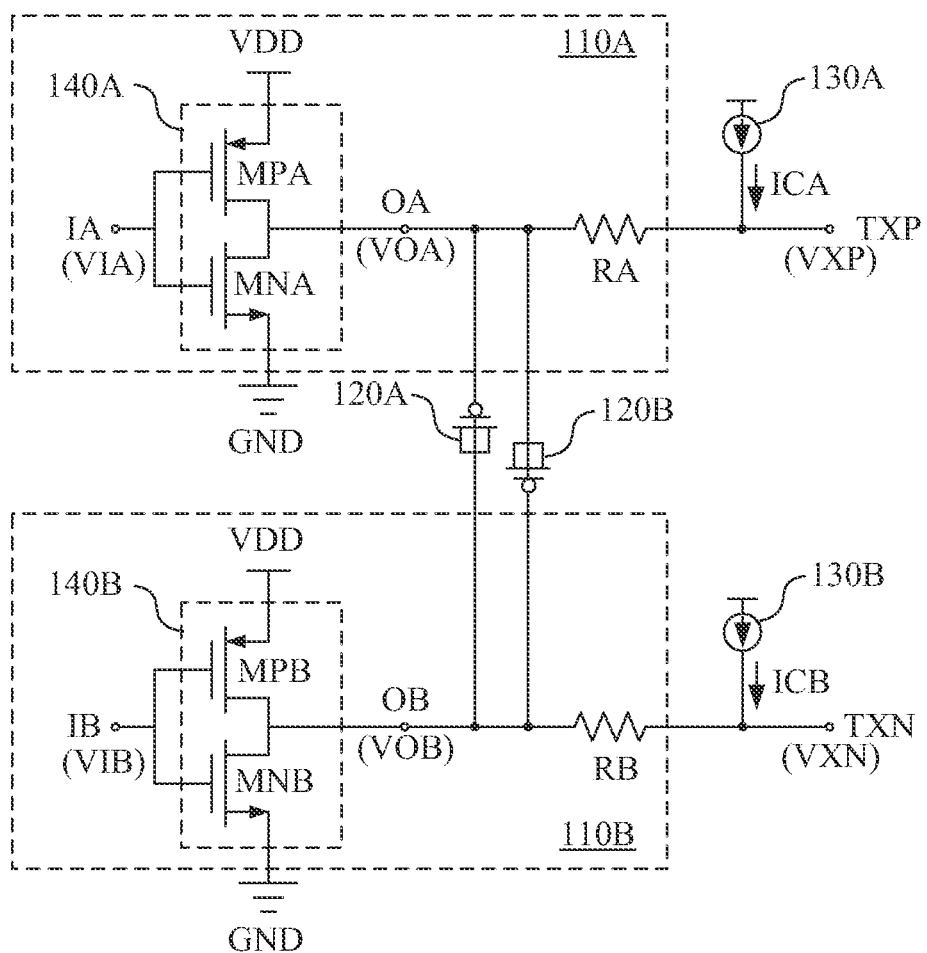
FIG. 1 illustrates a circuit diagram of a signal output apparatus according to an embodiment of the present invention.

Reference is now made to FIG. 1. FIG. 1 illustrates a circuit diagram of a signal output apparatus 100 according to an embodiment of the present invention. In an embodiment, the signal output apparatus 100 is disposed in a transceiver of a universal serial bus (USB) 2.0 interface. The signal output apparatus 100 includes two output circuits 110A and 110B, two MOS capacitors 120A and 120B and two current supplying circuits 130A and 130B.

Each of the output circuits 110A and 110B includes an inverter and a resistor.

Take the output circuit 110A as an example, the output circuit 110A includes an inverter 140A and a resistor RA. In an embodiment, the inverter 140A includes a PMOS transistor MPA and an NMOS transistor MNA.

The sources of the PMOS transistor MPA and the NMOS transistor MNA are respectively electrically coupled between a voltage source VDD and a ground terminal GND. The gates of the PMOS transistor MPA and the NMOS transistor MNA are both electrically coupled to an input terminal IA. The drain of the PMOS transistor MPA and the NMOS transistor MNA are both electrically coupled to an output terminal OA. The input terminal IA is configured to receive an input voltage VIA and an output voltage VOA is generated at the output terminal OA accordingly.

The resistor RA is electrically coupled between the output terminal OA and a differential output terminal TXP, to output the output voltage VOA from the output terminal OA to the differential output terminal TXP to generate a differential voltage VXP.

Take the output circuits 110B as an example, the output circuits 110B includes an inverter 140B and a resistor RB. In an embodiment, the inverter 140B includes a PMOS transistor MPB and an NMOS transistor MNB.

The sources of the PMOS transistor MPB and the NMOS transistor MNB are respectively electrically coupled between the voltage source VDD and the ground terminal GND. The gates of the PMOS transistor MPB and the NMOS transistor MNB are both electrically coupled to the input terminal IB. The drains of the PMOS transistor MPB and the NMOS transistor MNB are both electrically coupled to the output terminal OB. The input terminal IB is configured to receive an input voltage VIB and an output voltage VOB is generated at the output terminal OB.

The resistor RB is electrically coupled between the output terminal OB and a differential output terminal TXN, to output the output voltage VOB from the output terminal OB to the differential output terminal TXN to generate a differential voltage VXN.

It is appreciated that the signal output apparatus 100 outputs the pair of differential voltages VXP and VXN simultaneously in a differential manner.

The MOS capacitors 120A and 120B are electrically coupled between the output terminals OA and OB of the output circuits 110A and 110B in opposite directions. For example, the MOS capacitor 120A is electrically coupled between the output terminals OA and OB in a forward manner, and the MOS capacitors 120B is electrically coupled between the output terminals OA and OB in a reverse manner.

The MOS capacitors 120A and 120B are implemented by using metal oxide semiconductor transistors. The amount of the capacitance of each of the MOS capacitors 120A and 120B is related to a voltage difference between the output terminals OA and OB that the MOS capacitors 120A and 120B are electrically coupled to.

In an embodiment, when the voltage difference between the output terminals OA and OB is larger than a threshold voltage of the MOS capacitors 120A and 120B, the capacitance of each of the MOS capacitors 120A and 120B is larger than a predetermined level. When the voltage difference between the output terminals OA and OB is not larger than the threshold voltage of the MOS capacitors 120A and 120B, the capacitance of each of the MOS capacitors 120A and 120B is not larger than the predetermined level. In an embodiment, the threshold voltage of the MOS capacitors 120A and 120B is such as, but not limited to 0.7 volts.

The current supplying circuits 130A and 130B are respectively electrically coupled to one of the differential output terminals TXP and TXN of the two output circuits 110A and 110B. Each of the current supplying circuits 130A and 130B can be implemented by such as, but not limited to a current source and a corresponding switch control circuit (not illustrated). However, the present invention is not limited thereto.

In an embodiment, the signal output apparatus 100 equipped with the universal serial bus 2.0 interface can be operated under operation modes having different transmission speeds. More specifically, according to the difference of the transmission speeds, the signal output apparatus 100 can be operated under a low speed mode, a full speed mode and a high speed mode. In an embodiment, the low speed mode has the speed of 1.5 Mbps (192 KB/s). The full speed mode has the speed of 12 Mbps (1.5 MB/s). The high speed mode has the speed of 480 Mbps (60 MB/s).

Under the above-mentioned operation modes having the different transmission speeds, the parasitic capacitors in the inverters 140A and 140B of the output circuits 110A and 110B have different amounts of capacitances.

Take the inverter 140A as an example, under the low speed mode and the full speed mode having a lower speed, the parasitic capacitors between the gate and the drain of the both the PMOS transistor MPA and the NMOS transistor MNA have a larger parasitic capacitance. Such a characteristic forces the signal transition at the output terminal OA to have a lower slew rate, a higher voltage overshoot amount and a higher undershoot amount.

On the contrary, under the high speed mode having a higher speed, the parasitic capacitors between the gate and the drain of the both the PMOS transistor MPA and the NMOS transistor MNA have a smaller parasitic capacitance. Such a characteristic does not easily have impact on the signal generated at the output terminal OA.

As a result, the signal output apparatus 100 can have a better performance under the operation modes having different speeds by disposing the MOS capacitors 120A and 120B.

In the following paragraphs, the description of the operation of the signal output apparatus 100 is made under the condition that the low speed mode and the full speed mode having a lower speed are served as the first operation mode, and the high speed mode having a higher speed is served as the second operation mode.

Under the first operation mode, the current supplying circuits 130A and 130B are both disabled without outputting any current to the corresponding differential output terminals TXP and TXN.

Under such a condition, one of the input voltages VIA and VIB that the input terminals IA and IB of the output circuits 110A and 110B receives is a high state input voltage and the other is a low state input voltage. In an embodiment, the high state input voltage is 3.3 volts and the low state input voltage is 0 volt.

Through the operation of the inverters 140A and 140B, one of the output voltages VOA and VOB generated by the output terminals OA and OB is a low state output voltage, and the other is a high state output voltage. Furthermore, the differential output terminals TXP and TXN respectively receive the output voltages VOA and VOB through the resistors RA and RB, to generate the differential voltages VXP and VXN. One of the differential voltages VXP and VXN is a first operation mode differential low state voltage and the other is a first operation mode differential high state voltage.

For example, when the input voltages VIA and VIB are respectively the high state input voltage and the low state input voltage, the output voltages VOA and VOB are respectively the low state output voltage and the high state output voltage. The differential voltages VXP and VXN are respectively the first operation mode differential low state voltage and the first operation mode differential high state voltage. On the contrary, when the input voltages VIA and VIB are respectively the low state input voltage and the high state input voltage, the output voltages VOA and VOB are respectively the high state output voltage and the low state output voltage. The differential voltages VXP and VXN are respectively the first operation mode differential high state voltage and the first operation mode differential low state voltage.

In an embodiment, each of the high state output voltage and the first operation mode differential high state voltage is 3.3 volts. Each of the low state output voltage and the first operation mode differential low state voltage is 0 volt.

Under such a condition, since one of the output terminals OA and OB has the high state output voltage (e.g. 3.3 volts) and the other has the low state output voltage (0 volt), the voltage difference thereof is 3.3 volts, which is larger than the threshold voltage (e.g. 0.7 volts) of the MOS capacitors 120A and 120B. The capacitance of each of the MOS capacitors 120A and 120B is larger than the predetermined level.

Since the inverters 140A and 140B have larger parasitic capacitances under the first operation mode, the signal transition of the output voltages VOA and VOB has a faster slew rate, a larger voltage overshoot amount and a larger voltage undershoot amount. As a result, the larger capacitances of the MOS capacitors 120A and 120B can effectively decrease the slew rate and decrease both the voltage overshoot amount and the voltage undershoot amount at the same time.

Under the second operation mode, only one of the current supplying circuits 130A and 130B is enabled to output the supplying current to the corresponding one of the differential output terminals. For example, when the current supplying circuit 130A is enabled, the current supplying circuit 130A outputs a supplying current ICA to the differential output terminal TXP, while the current supplying circuit 130B is disabled. When the current supplying circuit 130B is enabled, the current supplying circuit 130B outputs a supplying current ICB to the differential output terminal TXN, while the current supplying circuit 130A is disabled.

Under such a condition, each of the input voltages VIA and VIB received by the input terminals IA and IB of the output circuits 110A and 110B is the high state input voltage. In an embodiment, the high state input voltage is 3.3 volts.

Through the operation of the inverters 140A and 140B, each of the output voltages VOA and VOB generated by the output terminals OA and OB is the low state output voltage.

Accordingly, based on whether the supplying current is received, one of the differential output terminals TXP and TXN generates a second operation mode differential high state voltage and the other generates a second operation mode differential low state voltage.

For example, when the differential output terminal TXP receives the supplying current ICA from the current supplying circuit 130A and the differential output terminal TXN does not receive the supplying current from the current supplying circuit 130B, the differential output terminal TXP outputs the second operation mode differential high state voltage and the differential output terminal TXN outputs the second operation mode differential low state voltage.

On the contrary, when the differential output terminal TXN receives the supplying current ICB from the current supplying circuit 130B and the differential output terminal TXP does not receive the supplying current from the current supplying circuit 130A, the differential output terminal TXN outputs the second operation mode differential high state voltage and the differential output terminal TXP outputs the second operation mode differential low state voltage.

In an embodiment, the second operation mode differential high state voltage is 0.4 volts. Each of the low state output voltage and the second operation mode differential low state voltage is 0 volt.

Under such a condition, the voltage difference between the output terminals OA and OB is 0 volt since both of the output terminals OA and OB has the low state output voltage (e.g. 0 volt), which is not larger than the threshold voltage (e.g. 0.7 volts) of the MOS capacitors 120A and 120B. The capacitance of each of the MOS capacitors 120A and 120B is not larger than the predetermined level.

Since the inverters 140A and 140B have smaller parasitic capacitances under the second operation mode, the output voltages VOA and VOB are not affected thereby. As a result, the smaller capacitances of the MOS capacitors 120A and 120B can effectively increase the slew rate without causing either voltage overshoot or voltage undershoot.

As a result, the signal output apparatus 100 of the present invention can be adapted to the operation modes having different speeds to lower the impact of the parasitic capacitors, so as to improve the signal output performance.

Figure 2:
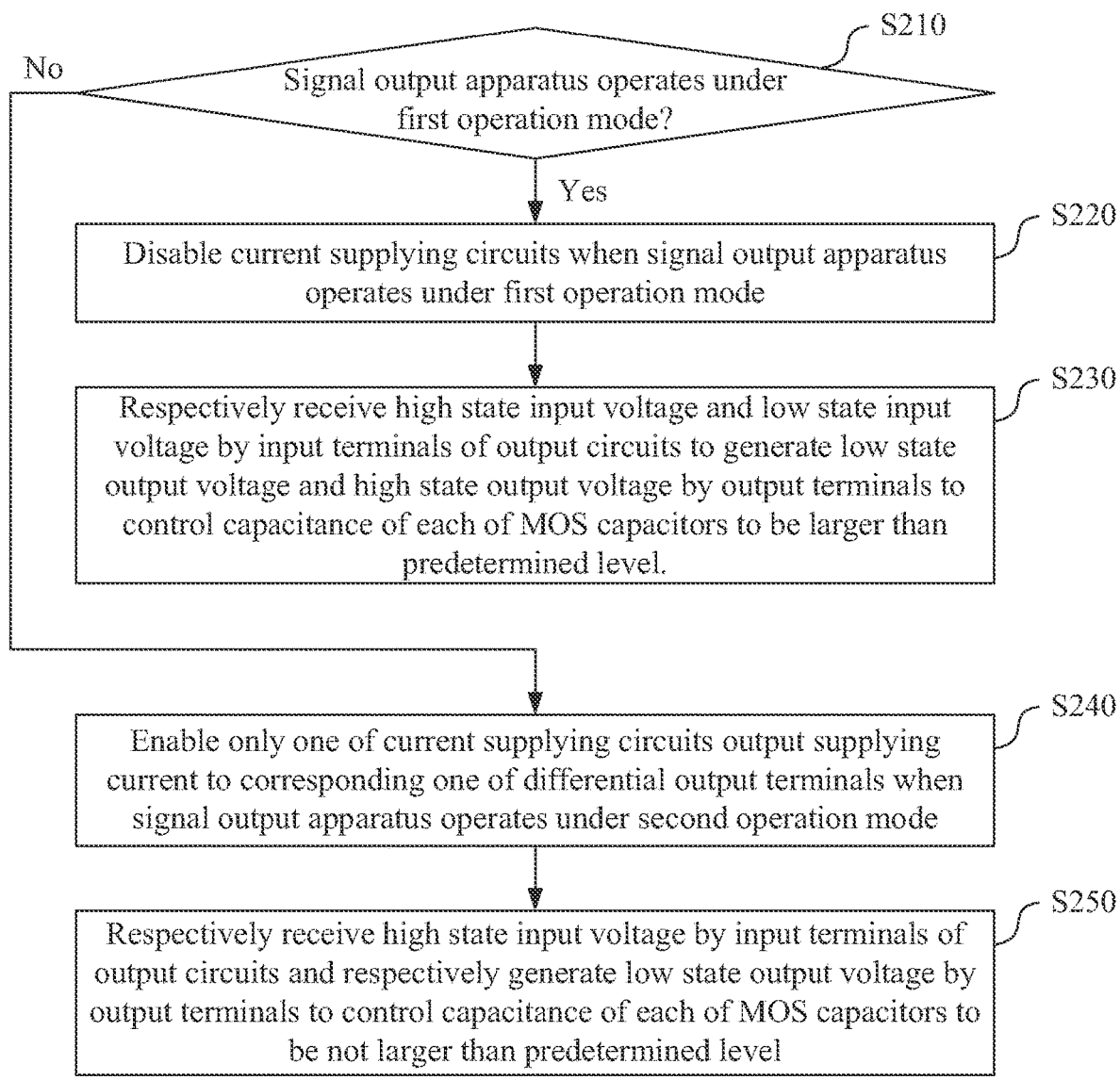
FIG. 2 illustrates a flow chart of a signal output method according to an embodiment of the present invention.

Reference is now made to FIG. 2. FIG. 2 illustrates a flow chart of a signal output method 200 according to an embodiment of the present invention.

In addition to the apparatus described above, the present disclosure further provides the signal output method 200 that can be used in such as, but not limited to, the signal output apparatus 100 in FIG. 1. As illustrated in FIG. 2, an embodiment of the signal output method 200 includes the following steps.

In step S210, whether the signal output apparatus 100 operates under the first operation mode is determined.

In step S220, when the signal output apparatus 100 operates under the first operation mode, the current supplying circuits 130A and 130B are disabled.

In step S230, the high state input voltage and the low state input voltage are respectively received by the input terminals IA and IB of the output circuits 110A and 110B to generate the low state output voltage and the high state output voltage by the output terminals OA and OB to control the capacitance of each of the two MOS capacitors to be larger than the predetermined level.

Under such a condition, the low state output voltage and the high state output voltage respectively generated by the output terminals OA and OB are transmitted to the differential output terminals TXN and TXP through the resistors RA and RB to generate the first operation mode differential high state voltage and the first operation mode differential low state voltage.

In step S240, when the signal output apparatus 100 does not operate under the first operation mode, the signal output apparatus 100 is determined to operate under the second operation mode. Only one of the current supplying circuits 130A and 130B is enabled to output either the supplying current ICA or ICB to the corresponding one of the differential output terminals TXN and TXP.

Under such a condition, the differential output terminals TXN and TXP generates the second operation mode differential high state voltage and the second operation mode differential low state voltage respectively based on whether the supplying current is received.

In step S250, the input terminals IA and IB of the output circuits 110A and 110B respectively receive the high state input voltage and the output terminals OA and OB respectively generate the low state output voltage to control the capacitance of each of the MOS capacitors 120A and 120B to be not larger than the predetermined level.

It is appreciated that the embodiments described above are merely an example. In other embodiments, it should be appreciated that many modifications and changes may be made by those of ordinary skill in the art without departing, from the spirit of the disclosure.

In summary, the signal output apparatus and the signal output method of the present invention can, by disposing MOS capacitors between two output terminals, generate different amounts of capacitances according to operation modes having different speeds to lower the impact of the parasitic capacitor, so as to improve the signal output performance.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A signal output apparatus, comprising:
    two output circuits each comprising:
        an inverter comprising an input terminal and an output terminal; and
        a resistor electrically coupled between the output terminal and a differential output terminal;
    two MOS capacitors each electrically coupled between the output terminals of the two output circuits in opposite directions; and
    two current supplying circuits each electrically coupled to the differential output terminal of one of the two output circuits;
    wherein under a first operation mode, the two current supplying circuits are disabled such that the input terminals of the two output circuits respectively receive a high state input voltage and a low state input voltage, and the output terminals respectively generate a low state output voltage and a high state output voltage to control a capacitance of each of the two MOS capacitors to be larger than a predetermined level;
    under a second operation mode, only one of the two current supplying circuits is enabled to output a supplying current to the corresponding differential output terminal such that the input terminals of the two output circuits respectively receive the high state input voltage, and the output terminals respectively generate the low state output voltage to control the capacitance of each of the two MOS capacitors to be not larger than the predetermined level.

2. The signal output apparatus of claim 1, wherein under the first operation mode, a voltage difference between the output terminals of the two output circuits is larger than a threshold voltage of the two MOS capacitors such that the capacitance of each of the two MOS capacitors is larger than the predetermined level;
    under the second operation mode, the voltage difference between the output terminals of the two output circuits is not larger than the threshold voltage of the two MOS capacitors such that the capacitance of each of the two MOS capacitors is not larger than the predetermined level.

3. The signal output apparatus of claim 1, wherein under the first operation mode, the differential output terminals corresponding to the two output circuits respectively receive the low state output voltage and the high state output voltage through the resistor to output a first operation mode differential low state voltage and a second operation mode differential high state voltage;
    under the second operation mode, the differential output terminal of the enabled one of the two current supplying circuits outputs a second operation mode differential high state voltage, and the differential output terminal of the another one of the two current supplying circuits outputs a second operation mode differential low state voltage.

4. The signal output apparatus of claim 3, wherein the second operation mode differential high state voltage is smaller than a threshold voltage of the two MOS capacitors.

5. The signal output apparatus of claim 1, wherein the signal output apparatus is disposed in a transceiver of a universal serial bus (USB) 2.0 interface, in which the first operation mode is a full speed mode or a low speed mode, and the second operation mode is a high speed mode.

6. The signal output apparatus of claim 1, wherein a parasitic capacitance of the inverter of the two output circuits and the capacitance of each of the two MOS capacitors together determine a slew rate, an overshoot amount and an undershoot amount of the voltage transition of the output terminals.

7. A signal output method used in a signal output apparatus, wherein the signal output apparatus comprises two output circuits, two MOS capacitors and two current supplying circuits, the two output circuits each comprising an inverter that comprises an input terminal and an output terminal, and a resistor electrically coupled to the output terminal and a differential output terminal, the two MOS capacitors each electrically coupled to the output terminals of the two output circuits in opposite directions, the two current supplying circuits each electrically coupled to the differential output terminal of one of the two output circuits, and the signal output method comprises:
    under a first operation mode, disabling the two current supplying circuits;
    under the first operation mode, respectively receiving a high state input voltage and a low state input voltage by the input terminals of the two output circuits, and respectively generating a low state output voltage and a high state output voltage by the output terminals to control a capacitance of each of the two MOS capacitors to be larger than a predetermined level;
    under a second operation mode, enabling only one of the two current supplying circuits to output a supplying current to the corresponding differential output terminal; and
    under the second operation mode, respectively receiving the high state input voltage by the input terminals of the two output circuits, and respectively generating the low state output voltage by the output terminals to control the capacitance of each of the two MOS capacitors to be not larger than the predetermined level.

8. The signal output method of claim 7, wherein under the first operation mode, a voltage difference between the output terminals of the two output circuits is larger than a threshold voltage of the two MOS capacitors such that the capacitance of each of the two MOS capacitors is larger than the predetermined level;
    under the second operation mode, the voltage difference between the output terminals of the two output circuits is not larger than the threshold voltage of the two MOS capacitors such that the capacitance of each of the two MOS capacitors is not larger than the predetermined level.

9. The signal output method of claim 7, further comprising:
- under the first operation mode, respectively receiving the low state output voltage and the high state output voltage through the resistor by the differential output terminals corresponding to the two output circuits, to output a first operation mode differential low state voltage and a second operation mode differential high state voltage;
- under the second operation mode, outputting a second operation mode differential high state voltage by the differential output terminal of the enabled one of the two current supplying circuits, and outputting a second operation mode differential low state voltage by the differential output terminal of the another one of the two current supplying circuits.

10. The signal output method of claim 9, wherein the second operation mode differential high state voltage is smaller than a threshold voltage of the two MOS capacitors.

11. The signal output method of claim 7, wherein the signal output apparatus is disposed in a transceiver of a universal serial bus 2.0 interface, in which the first operation mode is a full speed mode or a low speed mode, and the second operation mode is a high speed mode.

12. The signal output method of claim 7, wherein a parasitic capacitance of the inverter of the two output circuits and the capacitance of each of the two MOS capacitors together determine a slew rate, an overshoot amount and an undershoot amount of the voltage transition of the output terminals.

* * * * *